(12) United States Patent
Brown et al.

(10) Patent No.: US 8,064,269 B2
(45) Date of Patent: Nov. 22, 2011

(54) APPARATUS AND METHODS HAVING MAJORITY BIT DETECTION

(75) Inventors: Jason M. Brown, Allen, TX (US); Venkatraghavan Bringivijayaraghavan, Plano, TX (US)

(73) Assignee: Micron Technology, Inc., Boise, ID (US)

(*) Notice: Subject to any disclaimer, the term of this patent is extended or adjusted under 35 U.S.C. 154(b) by 605 days.

(21) Appl. No.: 12/114,613

(22) Filed: May 2, 2008

(65) Prior Publication Data

US 2009/0274245 A1    Nov. 5, 2009

(51) Int. Cl.
*G11C 7/10*    (2006.01)
(52) U.S. Cl. .................... 365/189.04; 365/203
(58) Field of Classification Search .......... 365/227, 365/189.04, 189.09, 203, 189.08
See application file for complete search history.

(56) References Cited

U.S. PATENT DOCUMENTS

| | | | | |
|---|---|---|---|---|
| 4,567,561 A | * | 1/1986 | Wyatt et al. | 712/245 |
| 2005/0018519 A1 | * | 1/2005 | Nii | 365/227 |
| 2008/0247257 A1 | * | 10/2008 | Brown | 365/227 |

* cited by examiner

*Primary Examiner* — Anh Phung
(74) *Attorney, Agent, or Firm* — Schwegman, Lundberg, & Woessner, P.A.

(57) ABSTRACT

Electronic apparatus and fabrication of the electronic apparatus that includes detection of the majority of values in a plurality of data bits may be used in a variety of applications. Embodiments include application of majority bit detection to process data bits in a device for further analysis in the device based on the results of the majority bit detection. In an embodiment, such further processing in a memory device after majority bit detection may include data bit inversion prior to outputting the data from the memory device.

15 Claims, 10 Drawing Sheets

APPARATUS AND METHODS HAVING MAJORITY BIT DETECTION

BACKGROUND

Operating electronic devices includes the consumption of power. Consumption of power can lead to depletion of a power supply, increased operational costs, and performance degradation associated with heating and other effects associated with current flows in the electronic devices. In complex devices, such as memories, there exist numerous operational current paths. Reducing power consumption in a memory without design complexity or significant impact to the speed of operation may enhance the overall performance of the memory.

DETAILED DESCRIPTION

The following detailed description refers to the accompanying drawings that show, by way of illustration, various embodiments of the present invention. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
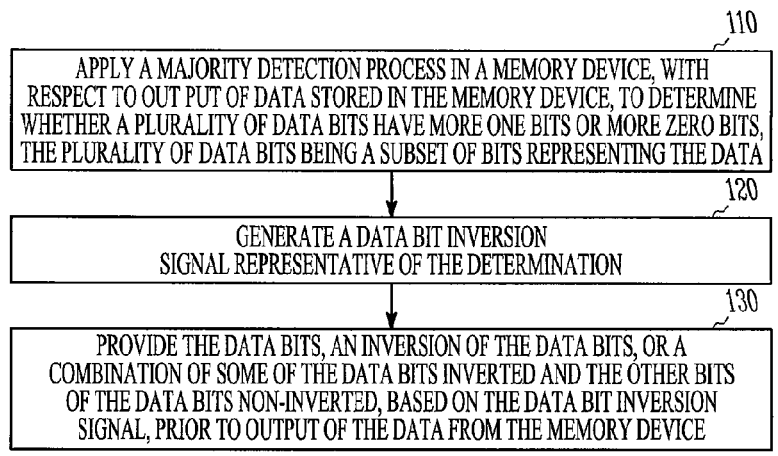
FIG. 1 shows features of a method that includes performing a majority detection process for possible data bit inversion of bits representing data prior to output the data from a memory device, according to various embodiments of the invention.

FIG. 1 shows features of a method that includes performing a majority detection process for possible data bit inversion of bits representing data prior to output the data from a memory device, according to various embodiments of the invention. A majority detection process herein is a process in which a determination in made as to what value representation occurs most often in an electrical representation of a specified data structure. In a binary digital system, a majority detection process determines whether a set of bits representing data has more one bits, "1," or more zero bits, "0." In some applications or systems, a one bit is represented by a voltage higher in magnitude than a voltage for a zero bit. In other applications or systems, a zero bit is represented by a voltage higher in magnitude than a voltage for a one bit. Additionally, some applications may consider the polarity of the voltage relative to some reference to define zeros and ones. In some applications or systems, a one bit is associated with a current higher in magnitude than a current for a zero bit. In other applications or systems, a zero is associated with a current higher in magnitude than a current for a one bit. Additionally, some applications may consider the direction of the current flow relative to some reference to define zeros and ones. The embodiments described herein are not limited by these applications.

Depending on the system architecture for providing data as data bits, such as a group of zeros and ones, from a memory device to a controller, the provisioning of the data bits may be realized by procedures that include turning on devices, such as transistors, depending on when the data bits have one of the two binary values. When the device, such as a transistor turns on, current flows through the transistor, consuming power. In some architectures, transferring a zero causes a particular transistor in the path of the zero data bit to turn on, while transferring a one bit in the same path causes the particular transistor to remain off. In other architectures, transferring a one causes a particular transistor in the path of the one data bit to turn on, while transferring a zero bit in the same path causes the particular transistor to remain off. For data represented by a group of bits, the transfer process can consume more power when the bits in the group being transferred are of the type that cause transfer devices to turn on. Data bit inversion (DBI) provides a technique in which data bits are inverted from a state that causes power consumption to the inverted state that uses less power. Data bits provided to a controller can be accompanied by a data bit inversion signal that provides an indication to the controller whether the data bits received by the controller are the actual data bits, representing specific data, or an inversion of the actual data bits. Data represented by a group or groups of bits may be referred to as a data word.

At 110, a majority detection process is applied in a memory device, with respect to the output of data stored in the memory device, to determine whether a plurality of data bits have more one bits or more zero bits, where the plurality of data bits are a subset of bits representing the data. The subset of bits representing data operatively stored in the memory device may be the full set of data bits that define the data. Alternatively, the set of bits representing the data may be arranged into groups of bits. Each group of bits may include a number of bits to which the majority detection process is not applied. In an embodiment, the first two bits of each group of bits are excluded from the majority detection process. The exclusion may be realized by skipping these bits when the other bits from the groups of bits are collected for the majority detection process.

Various techniques may be used to apply the majority detection process. The data bits to which the majority detection process is applied may be individually examined to determine if the individual bit is a one bit or a zero bit with an appropriate ones or zeros counter incremented. After all the relevant bits are examined, the count total of the ones and zeros counters can be compared to determine if there is a majority of ones or zeros. Another technique includes comparing a current set of data bits with the previous set of data bits to determine whether applying the current set to a set of devices would result in a majority of the devices, which receive the current set data bits, undergoing a change of state from the state set by the previous set of data bits. Another technique includes applying all the relevant bits to one input of a differential amplifier and applying all the relevant bits inverted to another input of the differential amplifier and examining the output of the differential amplifier. In an embodiment, all the relevant data bits to be examined can be arranged in groups of two or more bits and compared with the same grouping of all the relevant data bits inverted. The grouping of relevant data bits can be arranged to provide a process for determining the majority of ones and zeros and at the same time may reduce the number of devices through which current flows.

At 120, a data bit inversion signal representative of the determination of a majority is generated. The generation of the data bit inversion depends on which of the one bits or zero bits are a majority in the relevant data bits to which the majority detection process is applied and the architecture of the memory device. The data bit inversion signal may be generated with one of two values, where one value indicates inversion and the other indicates non-inversion. Alternatively, structures in the memory device may respond to one value and ignore other values of the data bit inversion signal. In addition, the data bit inversion signal may be configured as a group of signals. The group of signals may be generated as one data bit inversion signal for each bit where the data bit inversion signal indicates whether the corresponding bit should be inverted or not inverted. In an embodiment, the group of signals may be generated as one data bit inversion signal for each bit location corresponding to each of the groups in which bits at the bit location are serially processed for all the groups. In such a case, the data bit inversion signal indicates whether, for each of the groups, the $i^{th}$ bit in a group of n bits should be inverted or not inverted. In an embodiment, a data bit inversion signal is generated as a single data bit inversion signal indicating whether or not all the bits representing specific data to be output should be inverted. All the bits representing specific data may be one byte of data. The number of bits in a byte depends on the architectural design of a given memory device. All the bits representing specific data may be one word or multiple words of data.

At 130, the data bits, an inversion of the data bits, or a combination of some of the data bits inverted and the other bits of the data bits non-inverted, based on the data bit inversion signal, are provided prior to output of the data from the memory device. These bits may be provided prior to pre-charging operations in the memory device to output the data from the memory device.

The location of the data bit inversion in the memory device, based on the majority determination, may be selected based on the reduction of power consumption achievable by the selection. Particular data bits may undergo data bit inversion such that the conversion to inverted values reduces power consumption in subsequent processing of the bits in the memory device. For example, prior to output, the conductive lines on which data bits are transferred to output nodes (pins or pads) of the memory device can be pre-charged to a level relative to a reference voltage such as a supply source in the memory device. With a line configured to pre-charge at a high voltage relative to a lower voltage reference, such as ground, the bit transferred to this line that does not require toggling of the pre-charging level can allow an access transistor to remain off. The toggling of the pre-charging level may also be dependent on the form of drivers following the pre-charge section of the memory device. For a following driver, after pre-charge, that inverts a signal, a one (high) to an access transistor may turn on the transistor providing a current path to a reference voltage from a supply source coupled to the data path, which in turn provides a low input to the following driver that outputs a high signal, which is a one. In the same architecture, a zero (low) would not turn on the access transistor and the following driver would output a low signal, which is a zero. In such an architecture, the majority detection process would provide a data bit inversion signal to invert bits prior to pre-charging if the data bits examined have a majority of ones such that the inversion causes less access transistors to turn on to pre-charge, reducing the power consumption of the memory device. In an embodiment, the majority detection process in conjunction with data bit inversion may be realized in, but not limited to, a dynamic random access memory (DRAM).

Figure 2:
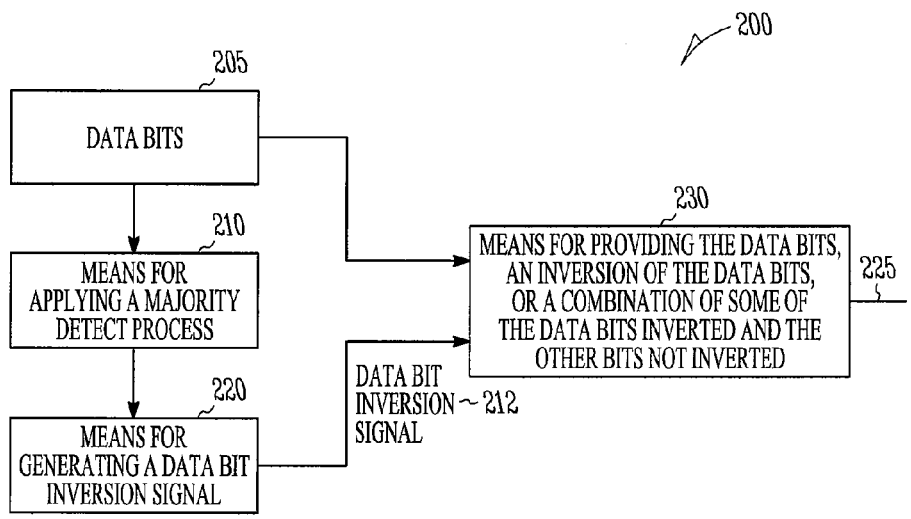
FIG. 2 shows a block diagram of features of a memory apparatus configured with a mechanism to apply a majority detect process and a data bit inversion process to data bits within the memory apparatus, according to various embodiments of the invention.

FIG. 2 shows a block diagram of features of a memory apparatus 200 configured with a mechanism to apply a majority detect process and a data bit inversion process to data bits 205 within the memory apparatus 200, according to various embodiments of the invention. Memory apparatus 200 includes means 210 for applying a majority detect process, whose result is used by a means 220 for generating a data bit inversion signal 212. The data inversion signal 212 from means 220 for generating a data bit inversion signal along with data bits 205 are provided to a means 230 for providing the data bits, an inversion of the data bits, or a combination of some of the data bits inverted and the other bits of the data bits non-inverted. The data bit inversion signal 212 is used by means 230 to provide inverted data bits, if any, indicated by the data bit inversion signal 212 prior to an output of the memory apparatus. From means 230, based on the data bit inversion signal, the appropriate form of data bits 205 are applied to line 225. Line 225 may be a part of a datapath on which pre-charging is conducted in memory apparatus 200 prior to output of data from memory apparatus 200.

A datapath is defined herein as a transfer path to transfer a representation of a data bit directed to be output from a data port of the memory apparatus and includes a device for pre-charging the transfer path. A datapath may be coupled directly to a data port, to a driver for a data port, or to a parallel-to-serial converter having multiple inputs coupled to different datapaths and a single output to direct a signal to a data port of a memory apparatus.

The data bits provided by memory apparatus 200 represents data stored in storage cells of memory apparatus 200. The number of data bits used to represent the data depends on the application and/or architecture associated with memory apparatus 200. The data may be represented by 8 bits, 16 bits, 32 bits, 128 bits, 256 bits, or other number of bits. The data may be output from memory apparatus 200 in parallel with each bit of a N bit data representation provided to a different one of the data output nodes (not shown in FIG. 2) of memory apparatus 200. In such an arrangement, N data output nodes are used for memory apparatus 200 to provide the data bits. Alternatively, the N bits representing data may be partitioned into M groups of k bits, N=M*k, with k bits in each group serially output from memory apparatus 200 such that one bit from each group is output in parallel at a different one of the data output nodes of memory apparatus 200. In such an arrangement, M data output nodes are used for memory apparatus 200 to provide the data bits. Other architectures and arrangement of data bits may be used.

Memory apparatus 200 may be arranged to operate in accordance with various embodiments including those embodiments discussed above with respect to FIG. 1. In memory apparatus 200, the data bits operated on by means 210 for applying a majority detect process may be the set of bits representing the data stored in and being processed for output from memory apparatus 200. Alternatively, in memory apparatus 200, means 210 for applying a majority detect process operates on a subset of the bits representing the data stored in and being processed for output from memory apparatus 200, where the data is represented by one or more bits in addition to the subset of data bits. These additional bits may be excluded from the majority detect process. Since operation of the majority detection process may include additional time in processing data bits for output after memory apparatus 200 responds to a request for data, allowing a number of bits to skip the majority detection process allows the majority detect process to be performed on the remaining bits while these skipped data bits are processed for output such that the majority detect process does not incur a time penalty. An architecture that allows a number of bits to skip the majority detection process may be realized with the data bits arranged in groups of bits for readout in a combination of a serial and parallel manner.

Means 210 for applying a majority detect process, means 220 for generating a data bit inversion signal, and means 230 for providing the data bits, an inversion of the data bits, or a combination of some of the data bits inverted and the other bits of the data bits non-inverted can be realized in a number of arrangements. Various embodiments taught herein include structures that apply a majority detect process, that generate a data bit inversion signal, and that provide data bits, an inversion of the data bits, or a combination of some of the data bits inverted and the other bits of the data bits non-inverted. Means 210, means 220, and means 230 may be implemented as devices and/or circuits interconnected. Means 210, means 220, and means 230 may be implemented as distinct sections of memory apparatus 200 connected via conductive lines or bus structures.

Figure 3:
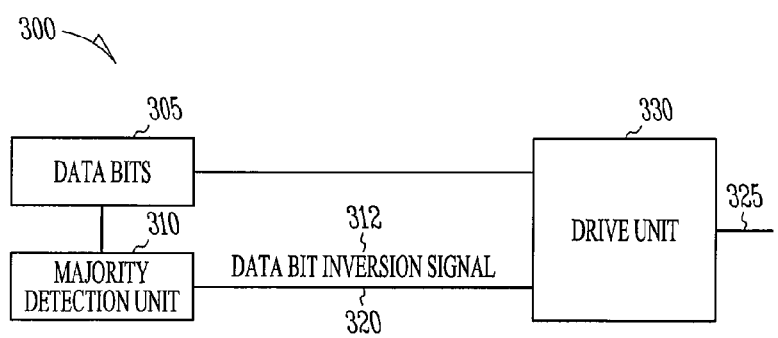
FIG. 3 illustrates features of an apparatus that uses a majority detection process, according to various embodiments of the invention.

FIG. 3 illustrates features of an apparatus 300 that uses a majority detection process, according to various embodiments of the invention. Apparatus 300 includes a majority detection unit 310 configured to apply a majority detection process to a subset of the data bits 305, where the set of data bits 305 are provided to driver unit 330. Majority detection unit 310 may be structured to determine whether a subset of data bits 305 have more one bits or more zero bits and to generate a data bit inversion signal 312 representative of the determination. Data bits 305 may include a data word representing a data symbol of other specific informational data. The subset of data bits 305 processed by majority detection unit 310 may be the total number of data bits 305 that represent the data or may be less than the total number of data bits 305 that represent the data. The data bit inversion signal 312 may be generated as a single data bit inversion signal for data bits or as a set of data bit inversions signals with each signal correlated to a single bit or a group of bits within data bits 305.

The data bit inversion signal 312 may be provided from majority detection unit 310 to driver unit 330 via line 320. Driver unit 330 is arranged to receive data bits 305 that includes the plurality of data bits that were provided to majority detection unit. Driver unit 330 operatively provides, based on the data bit inversion signal 312, the plurality of data bits, an inversion of the plurality of data bits, or a combination of some of data bits 305 inverted and the others of data bits 305 non-inverted to line 325.

The output of driver unit 330 depends on the architecture and/or application of apparatus 300. In an embodiment, driver unit 300 is configured to provide data bit inversion to bits of data bits 305 such that the conversion of the bit polarity reduces power consumption for operation of apparatus 300 as compared to other apparatus in similar applications that do not include an embodiment for a majority detection process and inversion process as disclosed herein. In an embodiment, apparatus 300 includes a memory device in which majority detection unit 310 and driver unit 330 are configured such that driver unit 330 operatively provides data inversion, based on the data bit inversion signal 312 from majority detection unit 310, with output to line 325 to a pre-charging unit prior to output of the data from the memory device.

Majority detection unit 310 may be arranged as a plurality of majority detectors. Each of these majority detectors may be arranged to operate on a different group of bits in which data bits 305 are arranged as a plurality of groups, where each group has a plurality of bits. Each of these majority detectors may be arranged to operate on bits selected from the different groups such that a single bit is selected from each group for the majority detection process in one majority detector. Alternatively, for data bits 305 arranged as a number of groups of bits, majority detection unit 310 may be arranged as a single unit to operate on selected bits from each group in a serial manner such that majority detection unit 310 operates on the $i^{th}$ bit of the respective groups followed by operating on the $(i+1)^{th}$ of the respective groups. Operation on bits from each group in a serial fashion may be realized using a clocking configuration to provide each group of bits for operation by majority detection unit 310.

Driver unit 330 may be arranged as a plurality of drivers. Each of these drivers may be arranged to operate on a different bit of data bits 305. In an embodiment, the plurality of drivers may include a number of drivers arranged to receive bits of data bits 305 that were not also sent to majority detector unit 310. These drivers, which receive data bits that are excluded from the majority detection process, may be configured without an input to receive a bit inversion signal 312. Alternatively, these drivers may be configured with an input to receive a bit inversion signal 312, but may also include an enable input allowing the driver to ignore the data bit inversion signal 312. Alternatively, driver unit 310, arranged as a single unit or a plurality of drivers, may be arranged to operate on a number of bits. Operation on a number of bits may be realized using a clocking configuration to operate on one bit in a specified time frame. The inversion operation of driver unit 330 or drivers of driver unit 330 may be realized in a number of different configurations. For example, driver unit 330 may include an arrangement that provides a data bit signal and the data bit signal inverted to a 2-to-1 multiplexer that has an enable input to select the input to couple to the single output of the multiplexer. The data bit inversion signal may be applied operatively to this enable input by driver unit 330.

Figure 4:
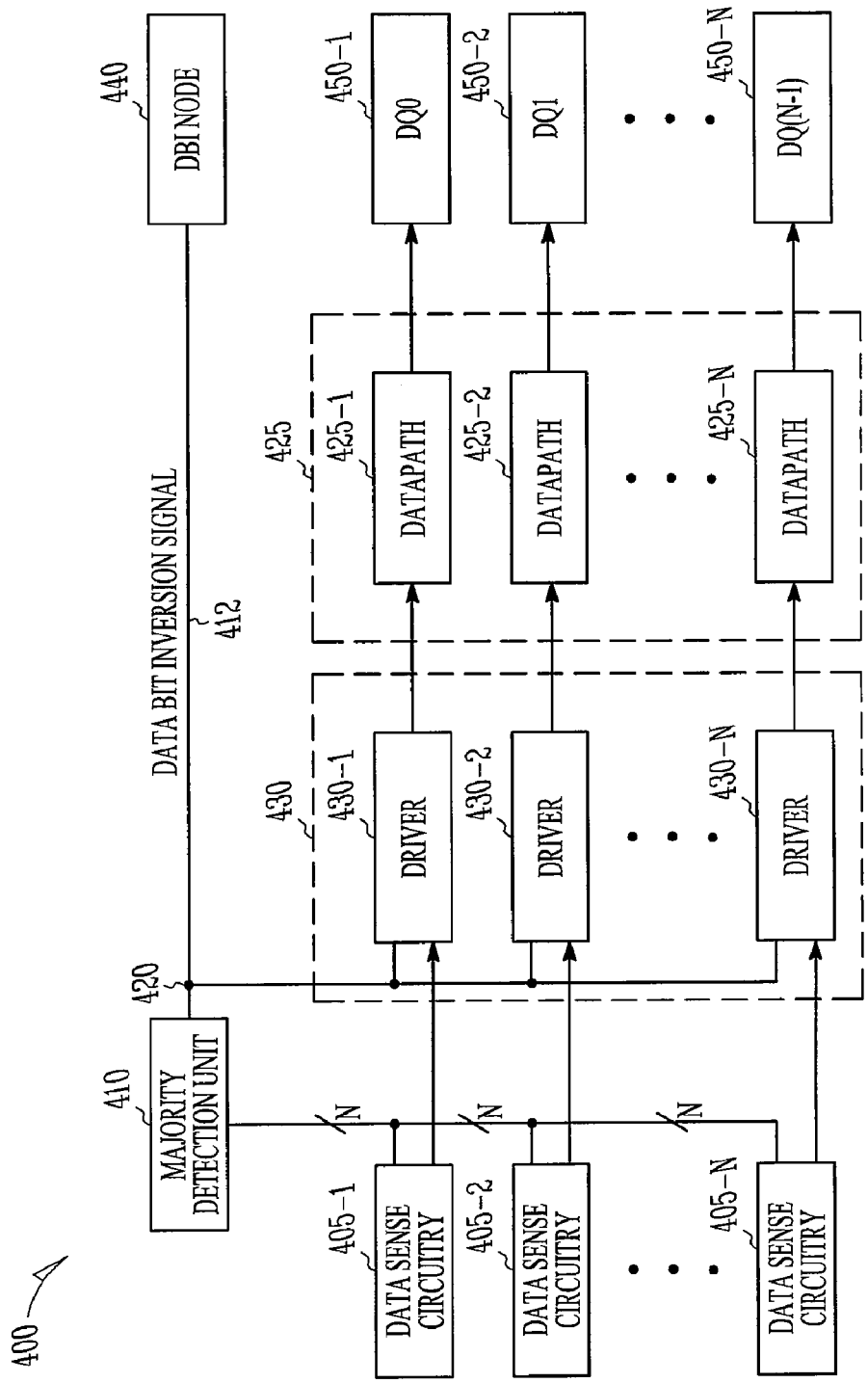
FIG. 4 illustrates features of a memory device that uses a majority detection process and data bit inversion process within the memory device, according to various embodiments of the invention.

FIG. 4 illustrates features of a memory device 400 that uses a majority detection process and data bit inversion process within the memory device, according to various embodiments of the invention. Memory device 400 includes data sense circuitry 405-1, 405-2 . . . 405-N, a majority detection unit 410, a driver unit 430, a datapath unit 425, a data bit inversion node 440, and data output nodes 450-1, 450-2 . . . 450-N. Various embodiments of a memory device that include a majority detection unit and a driver unit arranged with the majority detection unit, in a manner similar to that shown in FIG. 4, provide a mechanism to save on power consumption as compared to similar memory devices without the majority detection unit arranged with the driver unit in a similar manner. The determination of whether data bits from sense amplifiers 405-1, 405-2 . . . 405-N have a majority of one bits or zero bits allows driver unit 430 to invert (either directly or by selecting) bits for further processing, if such an inversion provides that datapath 425 consumes less power. Various other components that may form part of memory device 400 that are known by those of ordinary skill in the art are not shown in the figure in order to focus on features of the various embodiments disclosed herein.

Data stored in an array of data storage cells in memory device 400 are stored and read using various commands or combination of commands from a controller, such as a processor, to memory device 400. These storage and read requests may be processed in a conventional manner. In an operation to access the data in the memory array of memory device 400, data bits representing the data are read from their storage cells to data sense circuitry 405-1, 405-2, . . . 405-N. Data sense circuitry 405-1, 405-2, . . . 405-N may include data sense amplifiers. The number of data bits representing the data may be equal to the number of data sense circuits such that each data bit is directed to a different data sense circuitry 405-1, 405-2 . . . 405-N. Depending on the application and/or architecture, data may be represented by a word having N binary data bits, "1" or "0". N can be any number such as, 8, 16, 32, 128, 256, or some other number.

In an embodiment, each bit is provided by its corresponding data sense circuitry 405-1, 405-2 . . . 405-N to majority detection unit 410 substantially concurrently in parallel on N lines. Majority detection unit 410 determines whether these data bits have more one bits or more zero bits. Based on this determination, majority detection unit 410 generates a data bit inversion signal at 420, which is coupled to data bit inversion node 440 and to driver unit 430. Data bit inversion node 440 includes an output pad or pin that may be coupled to another device such as a controller to transmit the data bit inversion signal externally from memory device 400 to the other device. The occurrence of the data bit inversion signal 412 at data bit inversion node 440 provides a mechanism to indicate to external circuitry whether or not the data being transferred from data output nodes 450-1, 450-2 . . . 450-N is an inverted or non-inverted representation of the data being output. Data bit inversion signal 412 may be provided as a high or low signal to represent inversion or non-inversion depending on a particular architecture being implemented.

Driver unit 430 receives the data bit inversion signal 412 from node 420 and the data bits from data sense circuitry 405-1, 405-2 . . . 405-N. Depending on the state of the data bit inversion signal 412, driver unit 430 inverts the data bits received from data sense circuitry 405-1, 405-2, . . . 405-N. The inversion can be performed to allow memory device 400 to reduce power consumption during further processing of the data prior to output at data output nodes 450-1, 450-2 . . . 450-N. Depending on the architecture, driver unit 430 inverts the data bits if there is a majority of one bits and the further processing of one bits uses more power than processing zero bits if the zero bits are in a majority. Alternatively for another architecture, driver unit 430 inverts the data bits if there is a majority of zero bits and the further processing of zero bits uses more power than processing ones bits if the ones bits are in a majority. Inversion by driver unit 430 may include selection of an inverted version of the data bits presented to driver unit 430. In an embodiment, driver unit 430 may be structured as a plurality of drivers 430-1, 430-2 . . . 430-N. The number of drivers may be in a one-to-one correspondence with the number of data sense circuitry.

In an embodiment, drivers 430-1, 430-2 . . . 430-N provide the data bits or an inversion of the data bits to datapath unit 425 for pre-charging prior to output at data output nodes 450-1, 450-2 . . . 450-N. Datapath unit 425 may be configured as a plurality of datapaths 425-1, 425-2 . . . 425-N for pre-charging a line for each data line. The number of datapaths of datapath unit 425 may be in a one-to-one correspondence with the number of drivers of driver unit 430. From datapaths 425-1, 425-2 . . . 425-N, data bits or inverted data bits are provided at data output nodes 450-1, 450-2 . . . 450-N for use by external devices.

Figure 5:
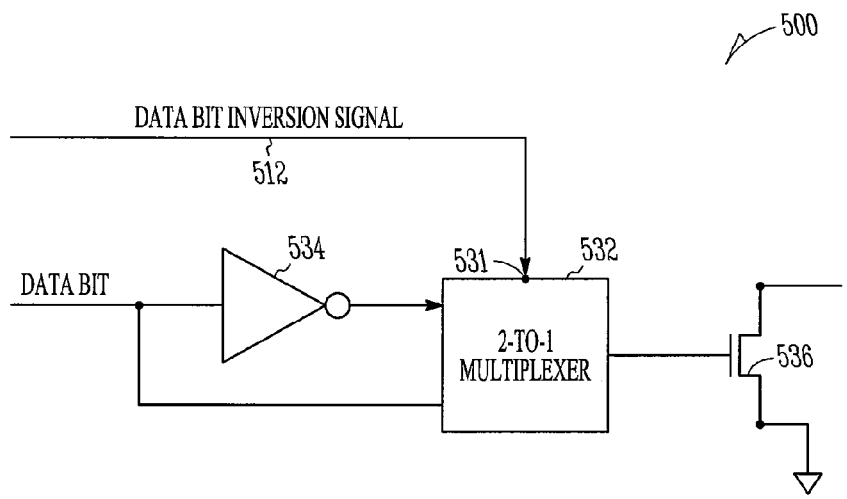
FIG. 5 illustrates an embodiment of a driver that may be implemented in the memory device of FIG. 4.

FIG. 5 illustrates an embodiment of a driver 500 that may be implemented in the memory device of FIG. 4. Driver 500 includes a 2-to-1 multiplexer 532 having a control (enable) input 531, an inverter 534, and a transistor 536. A data bit signal and an inverted data bit signal, provided by inverter 534, are input to 2-to-1 multiplexer 532. A data bit inversion signal 512 is operatively provided to 2-to-1 multiplexer to select either the data bit signal or the inverted data bit signal, depending on the state of data bit inversion signal 512. The single output from 2-to-1 multiplexer 532 provides the data bit signal or the inverted data bit signal for further processing such as at datapath unit 425 of FIG. 4.

Figure 6:
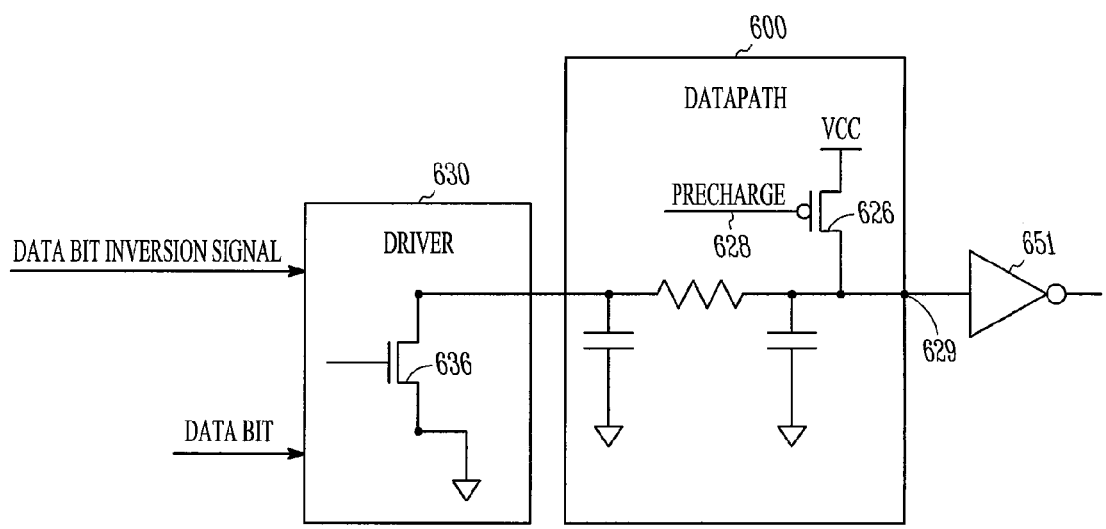
FIG. 6 illustrates an embodiment of a datapath 600 that may be implemented in the memory device of FIG. 4 in conjunction with a driver such as illustrated in FIG. 5.

FIG. 6 illustrates an embodiment of a datapath 600 that may be implemented in the memory device of FIG. 4 in conjunction with a driver such as illustrated in FIG. 5. Datapath 600 is coupled to driver 630 to receive a signal from output transistor 636. Datapath 600 includes transistor 626 coupled to supply voltage $V_{CC}$ and to output 629. Output 629 may be coupled to a data output node such as one of 450-1, 450-2 . . . 450-N, such as through a driver of a data output node, or to another internal component of memory device 400. In an embodiment, output 629 may be coupled to a driver 651 of a data output node that operatively inverts the signal present at node 629. Datapath 600 includes a precharge enable 628 to turn on transistor 626. Precharge enable 628 may be coupled to a constant voltage or a gated voltage depending on the application.

With a zero (low) input to transistor 636 and transistor 626 on, transistor 636 is off with no current flow from the supply $V_{CC}$ through transistor 636, and the output at 629 is high. With the output 629 coupled to inverting driver 651 for a data output node, a zero is provided at the data output node, such as one of 450-1, 450-2 . . . 450-N. Signals can be timed such that transistor 626 turns off before the input to transistor 636 goes high. The output at 629 is low. With the output 629 coupled to inverting driver 651 for a data output node, a one is provided at the data output node. With a plurality of datapaths, each such as depicted in FIG. 6, and a plurality of drivers, each such as depicted in FIG. 5, used in conjunction with the majority detection unit of FIG. 4, the majority detection unit can be configured to provide a data bit inversion unit signal such that the majority of the transistors 636 of the plurality of drivers 630 receive a low signal at their respective gates such that the transistors are in an off state. Some architectures may represent a zero with a high voltage value relative to the voltage value of a one. In such cases, the components discussed relative to FIGS. 4-6 may be configured to adjust for such a design.

Figure 7:
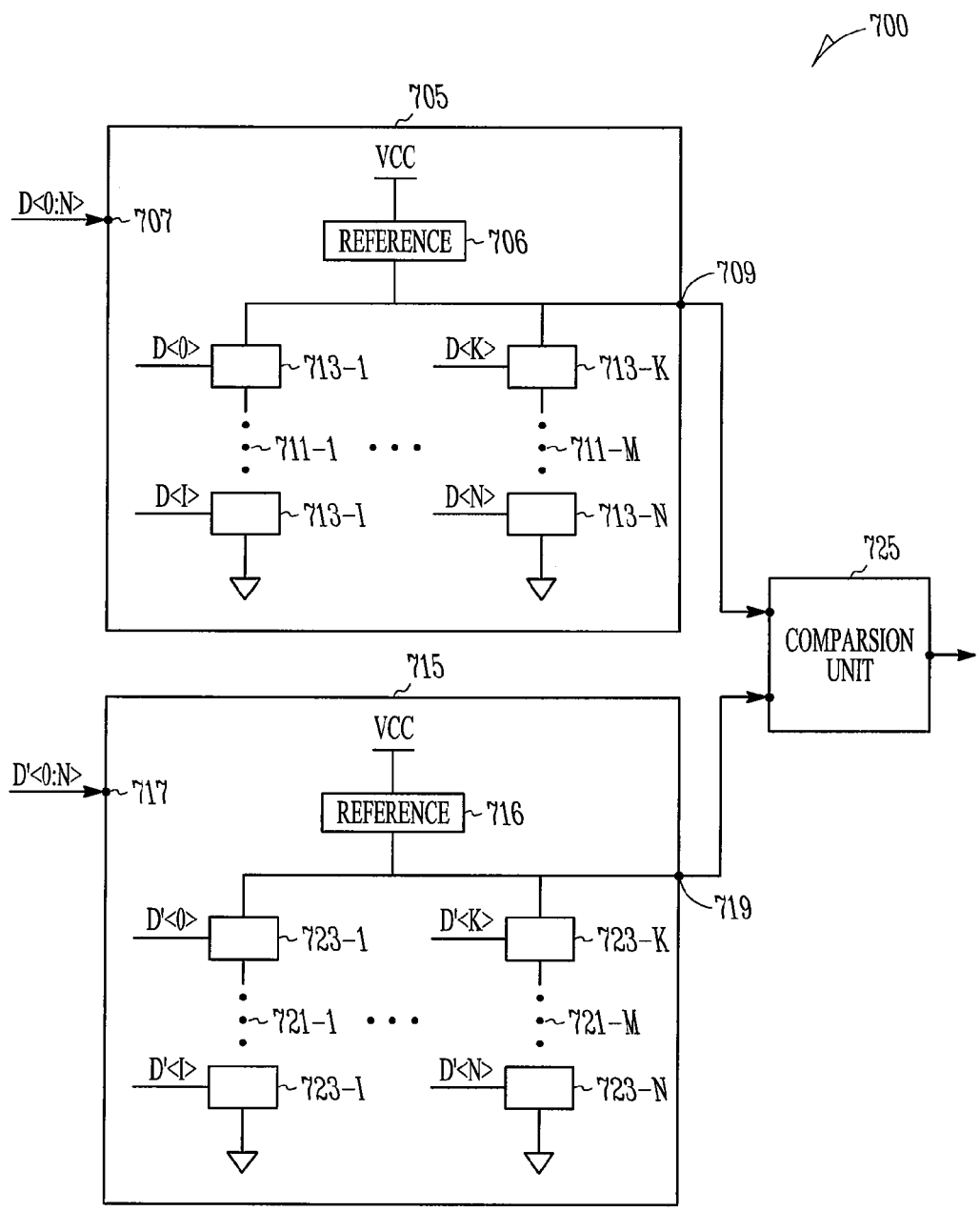
FIG. 7 shows a block diagram of features of a majority detection unit, according to various embodiments of the invention.

A majority detection unit for implementation in a memory device, such as that of FIG. 4, or for implementation in other devices having changing states according to groups of values may be configured in various manners. FIG. 7 shows a block diagram of features of an embodiment of a majority detection unit 700, according to various embodiments of the invention. Majority detection unit 700 includes evaluation unit 705 and evaluation unit 715, where each is coupled to comparison unit 725.

Evaluation unit 705 includes a plurality of input nodes 707 to receive a plurality of data values D<0:N>, where each data value is operatively provided to a different one of the input nodes 707, and an output node 709. In various embodiments, a data value may be a one bit or a zero bit. In other embodiments, each data value may represent one of a set of values. Evaluation unit 705 includes a number of legs 711-1 . . . 711-M, where each leg has a number of access devices 713-1 . . . 713-I . . . 713-$k$ . . . 713-N. Each access device 713-1 . . . 713-I . . . 713-$k$ . . . and 713-N has a control terminal coupled to a different one of the input nodes to receive a data value D<j>. Legs 711-1 . . . 711-M are arranged in parallel with each other. Each leg 711-1 . . . 711-M is coupled to a reference device 706 that provides access to supply voltage $V_{CC}$. The other end of each leg 711-1 . . . 711-M is coupled to another voltage reference source, such as ground. The number of access devices in each leg 711-1 . . . 711-M is greater than or equal to two.

Evaluation unit 715 includes a plurality of input nodes 717 to receive the plurality of data values inverted, D'<0:N>, where each inverted data value is operatively provided to a different one of the input nodes 717, and an output node 719. Evaluation unit 715 includes a number of legs 721-1 . . . 721-M, where each leg has a number of access devices 723-1 . . . 723-I . . . 723-$k$ . . . 723-N. Each access device 723-1 . . . 723-I . . . 723-$k$ . . . and 723-N has a control terminal coupled to a different one of the input nodes to receive an inverted data value D'<j>. Legs 721-1 . . . 721-M are arranged in parallel with each other. Each leg 721-1 . . . 721-M is coupled to a reference device 716 that provides access to supply voltage $V_{CC}$. The other end of each leg 721-1 . . . 721-M is coupled to another voltage reference source, such as ground. The number of access devices in each leg 721-1 . . . 721-M is greater than or equal to two.

The access devices in evaluation unit 705 and evaluation unit 715 may be realized in a number of ways. The access devices may include a transistor having a gate as a control terminal. The access devices may include a transistor circuit using one or more inputs to one or more base nodes of transistors as a control terminal. The access devices may include a logic circuit having a pass gate arranged as a control element. The access device may be selected based on the architecture for the device in which majority detection unit 700 is constructed such that the input values applied to the access devices are used to allow or to prevent current in the corresponding leg of the evaluation unit depending on the value input the access device.

Comparison unit 725 is coupled to both outputs 709 and 710 to compare results of an evaluation of the data values and the data values inverted in a similar configuration. The output from comparison unit 725 may be used as a data value inversion signal representative of whether the data has a majority of one type of value or another. The configuration of majority detection unit 700 allows a determination of the majority value type in N data values such that at most M current paths are in a conducting state when the data values are all of one type.

Figure 8:
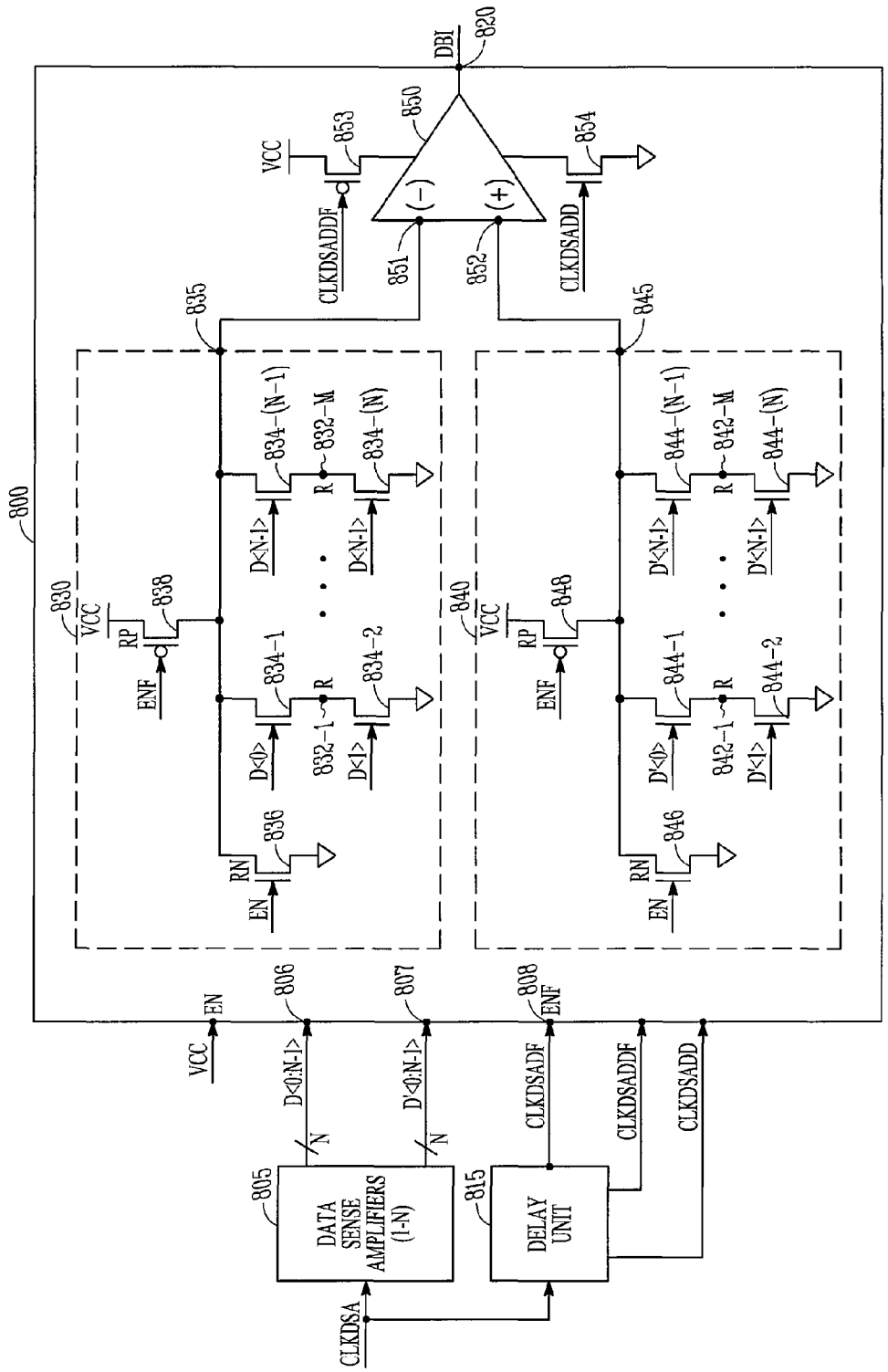
FIG. 8 shows a block diagram of features of a majority detector that may be implemented in conjunction with various structures and methods, such as shown in FIGS. 1-6, according to various embodiments of the invention.

FIG. 8 shows a block diagram of features of a majority detector 800 that may be implemented in conjunction with various structures and methods, such as shown in FIGS. 1-6, according to various embodiments of the invention. Majority detector 800 is coupled to data sense amplifiers 805 to operatively receive N data bits. Data sense amplifiers 805 include multiple sense amplifies with each sense amplifier operable on a different one of the N data bits. The N data bits are provided to majority detector 800 via N lines at a plurality of inputs 806 also referenced as D<0:N-1>. This nomenclature follows a common usage of designating the first bit as the $0^{th}$ bit. The N data bits inverted are provided to majority detector 800 via N lines at a plurality of inputs 807 also referenced as D'<0:N-1>. The value of N depends on the embodiment and may be equal to 8, 16, 32, 64, 128, 256 or some other numbers divisible by two. Majority detector 800 provides a data bit inversion signal at DBI (data bit inversion) node 820.

The operation of majority detector 800 may be performed in conjunction with a clock signal, CLKDSA (clock data sense amplifier), that is provided to data sense amplifiers 805. In operations of the embodiment shown in FIG. 8, if the number of data ones is greater than the number of data zeros, then the DBI signal at node 820 will be low or transitions low. If the number of data ones is less than the number of data zeros, then the DBI signal at node 820 will be high or transitions high. If the number of data ones equals the number of data zeros, then the DBI signal at node 820 may be a level indicative of a "do not care" state. Depending on the architecture, an equal number of data ones and data zeros may result in selection of the DBI signal as a low or as a high. In some embodiments, such a "do not care" state may be further modified following majority detector 800. The modification may depend on the location at which majority detector 800 is constructed in the memory. Other embodiments may provide for the DBI signal to be low for a majority of zero bits and high for a majority of one bits.

Majority detector 800 is arranged with two units 830 and 840 to evaluate whether the N data bits have more one data bits or more zero data bits. Unit 840 may be formed in substantially the same manner as unit 830 except that data bits D<0:N-1> are operatively provided to unit 830 from input nodes 806 and inverted data bits D'<0:N-1> are operatively provided to unit 840 from input nodes 807. Other designs may include the data bits inverted within majority detector 800 rather than having inverted data bits provided to majority detector 800.

Unit 830 includes a number of legs 832-1 . . . 832-M, where M=N/2. Each leg 832-1 . . . and 832-M has two transistors arranged in series between an output node 835 of unit 830 and a reference, such as ground. Each transistor, 834-1, 834-2, . . . 834-(N-1), 834-N, is operatively coupled to a different one of the input nodes 806 to receive a different one of the data bits D<i>. Each leg is in parallel with each of the other legs and in parallel with a bias transistor 836 whose gate receives an enable signal EN from a supply voltage $V_{CC}$ such that bias transistor 836 is activated when the majority detection process is initiated and performed. Legs 832-1...832-M and bias transistor 836 are coupled effectively at node 835 to an enable transistor 838 that has a gate coupled to input 808, ENF. A clock signal may be provided at ENF such that the majority detection process is activated at select time periods with no power being consumed when the majority detection process is not being performed. Enable transistor 838 is also coupled to supply voltage $V_{CC}$.

Unit 840 includes a number of legs 842-1...842-M, where M=N/2. Each leg 842-1... and 842-M has two transistors arranged in series between an output node 845 of unit 840 and a reference, such as ground. Each transistor, 844-1, 844-2,...844-(N-1), 844-N, is operatively coupled to a different one of the input nodes 807 to receive a different one of the inverted data bits D'<i>. Each leg is in parallel with each of the other legs and in parallel with a bias transistor 846 whose gate receives enable signal EN from a supply voltage $V_{CC}$ such that bias transistor 846 is activated when the majority detection process is initiated and performed. Legs 842-1...842-M and bias transistor 846 are coupled effectively at node 845 to an enable transistor 848 that has a gate coupled to input 808, ENF. A clock signal may be provided at ENF such that the majority detection process is activated at select time periods with no power being consumed when the majority detection process is not being performed. Enable transistor 848 is also coupled to supply voltage $V_{CC}$.

Output 835 of unit 830 is coupled to amplifier 850 at input node 851 and output 845 of unit 840 is coupled to amplifier 850 at input node 852. In an embodiment, input node 851 is referenced as a negative input and input node 852 is referenced as a positive input. Amplifier 850 is also coupled to control transistor 853, whose gate is operatively coupled to a clock signal, and to control transistor 854, whose gate is operatively coupled to a clock signal. Amplifier 850 has an output coupled to DBI node 820 to provide a DBI signal.

In a memory in which a majority detector, such as majority detector 800, is structured, a request for data stored in memory cells of one or more memory arrays of the memory are supplied by the memory using timing signals. Data sense amplifiers 805 receive CLKDSA to provide the timing waveforms for operation of these amplifiers on the N data bits provided from the memory array(s). Clock signal CLKDSA may also be used to control the timing of the performance of a majority detection process on the data bits received by data sense amplifiers 805 prior to output of these bits from the memory. Since the operation by data sense amplifiers 805 on the N data bits occurs over a time period, to operate majority detector 800 with the data bits that are provided, the clocks used by majority detector 800 may be a delayed version of CLKDSA correlated to the processing time of data sense amplifiers 805. Delay unit 815 may be provided to provide a set of delayed versions of CLKDSA. Clock signal CLKDSADF may be provided from delay unit 815 to input 808 as ENF for use by units 830 and 840. ENF is used to control enable transistor 838 and enable transistor 848 such that current flows in bias transistor 836 and bias transistor 846 only during operation of the majority detection process. In operation, control transistors 853 and 854 may be controlled with control signals separate from the clocks for units 830 and 840. The clocks signals for control transistors 853 and 854 may be provided such that these control transistors may be activated prior to the N data bits being provided to majority detector 800. Delay unit may provide signals CLKDSADDF and CLKDSADD for use by control transistors 853 and 854, respectively. In an embodiment, CLKDSADDF and CLKD-SADD may be the same signal. The clock signals used may be timing waveforms correlated to data commands or data requests rather than continuously running periodic signals.

Delay unit 815 may be arranged as a number of delay elements such that different timing signals may be generated from delay unit 815 by tapping different delay elements. The delay elements may be a series of inverters, logic devices, or other devices to delay a signal without substantially altering the waveform of the signal.

In operation, with respect to power use of majority detector 800, the worst case occurs when the N data bits are all zeros or all ones. In such a case, there are M=N/2 legs in only one of units 830 and 840 on, with all the legs in the other unit are off. With N=32 and M=16, there are 16 legs on to evaluate 32 bits. For N=32 with 15 bits of one type (0 or 1) and 17 bits of the other type, the worst case is that 15 legs are on, while the best case is that 1 leg is on. Thus, majority detector 800 provides a low power majority detection process since, to evaluate N bits, the maximum number of legs that are on for the evaluation is N/2.

The range of voltage swings in the operation of majority detector 800 can be controlled by the on-resistances RP of enable transistors 838 and 848 and the on-resistances RN of bias transistors 836 and 846, where selection of the appropriate value for RP and RN clamp the maximum voltage, Vmax. The on-resistances of each leg 832-*i* and 842-*i* may be set substantially to the same resistance value R. The on-resistances of each leg 832-*i* and 842-*i* may be arranged with known values of resistance for each leg selected, in design, individually for each leg. The arrangement may be a weighted resistance correlated to the index of the leg. These on-resistances may be determined by the parameters for the transistors used for majority detector 800 when constructing majority detector 800 on the integrated circuit (chip) with the other components of the memory in which it is structured.

The speed of the majority detect circuit is determined by the case when the number of ones is one more or one less than the number of zeros. In this case, $\Delta V$, $\Delta V$=(+) voltage at node 851 minus (−) voltage at node 852, is (Vmax−Vmin)/M. For 32 data bits, the number of legs is 16 so that when evaluating 32 data bits, the number of voltage steps between (+) and (−) is 16. For the evaluation of N data bits, the number of voltage steps between (+) and (−) is N/2=M. Majority detector 800 may provide a low power, high speed process for majority detection within a memory that can be applied to operations on data bits within the memory prior to output of these data bits from the memory. Such a process may be provided to these data bits prior to pre-charging for output from the memory. In an embodiment, the memory may be realized as, but is not limited to, a DRAM.

A majority detection process applied to a set of data bits may increase the time to process these data bits from a memory. In various embodiments, a majority detection process may be applied in which the process does not substantially impact the timing of the output of the data bits after a request for the data has been received by the memory. In an architecture in which a number of bits in a group of bits are known to be output first prior to the output of the remaining bits of the group, these number of bits may be routed to skip the majority detection process. Thus, during the time period that these bits, excluded from the majority detection, are being output, the majority detection process may be applied to the remaining bits of the group such that these remaining data bits are provided for output at substantially the same time that they would be output without undergoing the majority detection process. If two bits are skipped and a majority detection process is implemented, then each group of bits, which may be referred to as a burst, has four or more bits in some embodiments.

In an embodiment, an array of data storage cells of a memory is arranged such that data is output as data bits from the array, where the data bits are arranged as a plurality of groups of bits. Each group of bits has the same number of bits such that the bits from the group are arranged to be in a common number of effective bit locations. Data output nodes of the memory to output the data from the memory device are arranged such that each data output node is correlated to a different one of the groups of bits. For example, 50 bits may be arranged as five groups of 10 bits where each of the 10 bits is identified with a bit location i, $0 \leq i \leq 9$. Each of the five groups may be assigned to a different one of five data output nodes of the memory. Since one group having 10 bits is assigned to one of the five data output node, these bits are output serially with bit location 0 sent first and bit location 9 sent last. The common bit locations at each of the five data output nodes are output at substantially the same time.

A majority detection unit may be configured to apply a majority detection process to determine whether the data bits corresponding to a common bit location of the groups of bits have more one bits or more zero bits for each common bit location and to generate a data bit inversion signal representative of the determination for each common bit location. The majority detection unit may be configured to operatively skip the majority detection process for a number of common bit locations of each group. This exclusion may be realized with the majority detection unit configured without a connective line to receive bits at the bit locations designed for skipping the majority detection process. The majority detection unit may include inputs that allow the selection of the bit locations to be processed or not processed based on an enable input. The majority selection unit may be arranged as a plurality of majority detectors such that each majority detector operates only on the common bit locations of the groups into which the data is partitioned.

The data bit inversion signal may be generated as a plurality of data bit inversion signals. Alternatively, the data bit inversion signal may be generated as a time multiplexed data bit inversion signal with each time unit corresponding to the bit location subjected to the majority detection process. The data bit inversion signal, in the format of the particular architecture, can be provided to a driver to further process the data bits for output from the memory.

The driver unit may be arranged to receive each group of data bits and the data bit inversion signal corresponding to each common bit location group and to operatively provide, based on the data bit inversion signal, each data bit of each group or an inversion of each data bit prior to output of the data from the memory device. Inverted data bits may be provided to the driver unit or the driver unit may be configured to invert data bits that it receives. Bits from the driver unit may be provided to a pre-charging unit prior to output of the data from the memory device. The driver unit may be arranged as a plurality of drivers, one for each data bit, that are grouped according to the groups of data bits with each group of drivers corresponding to a different one of the data output nodes of the memory. For each data output node, a parallel-to-serial converter may be arranged to receive bits of one group of bits processed by one group of drivers for serial output as discussed above.

Figure 9A:
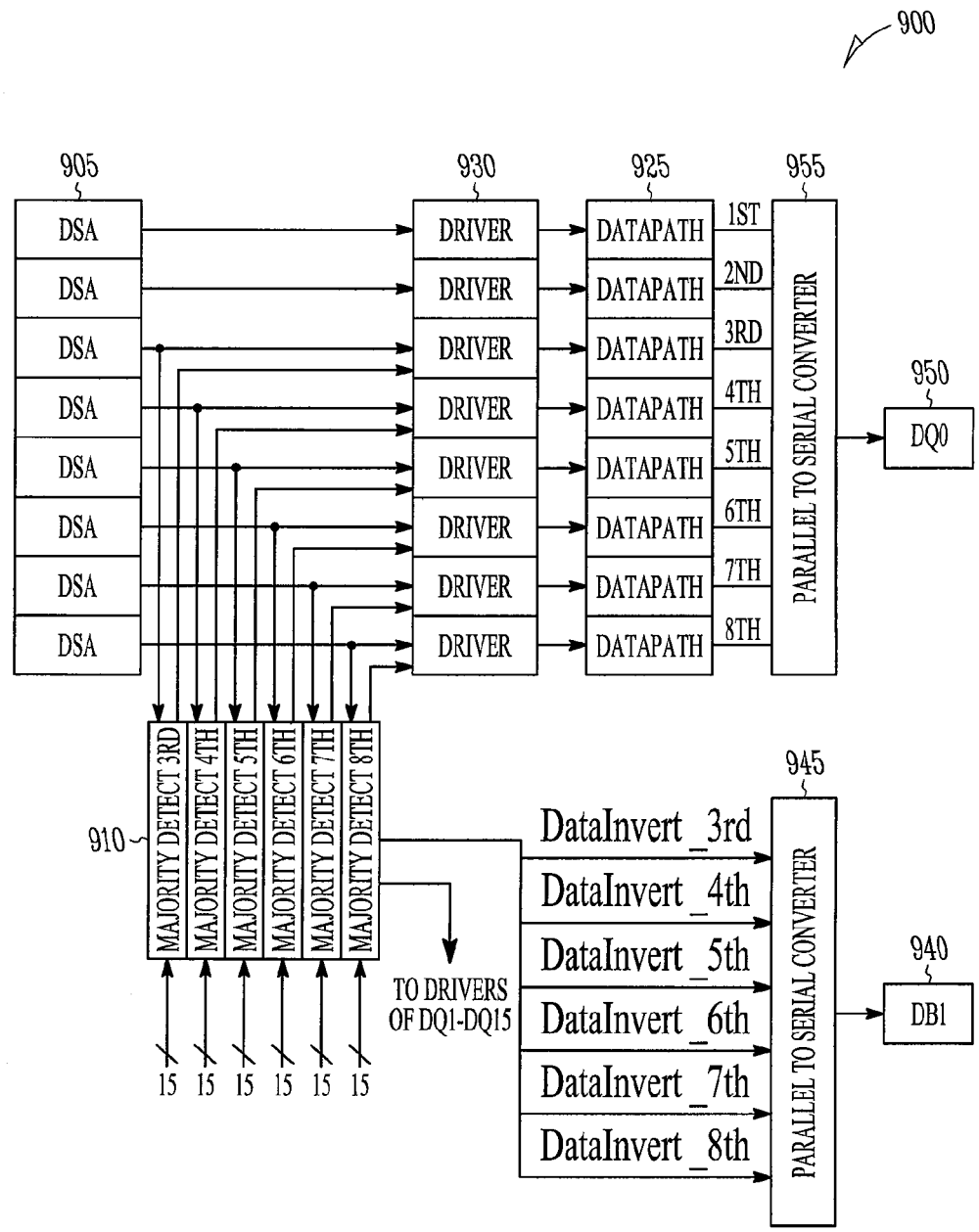
FIG. 9A shows a block diagram illustrating features of a memory device that includes a majority detection process in which a number of bits from a group of data bits are excluded from the majority detection process, according to various embodiments of the invention.

FIG. 9A shows a block diagram illustrating features of a memory device 900 that includes a majority detection process in which a number of bits from a group of data bits are excluded from the majority detection process, according to various embodiments of the invention. Memory device 900 includes a plurality of data output nodes. Associated with each data output node is a plurality of data sense amplifiers, a plurality of drivers, a plurality of datapaths, and a parallel-to-serial converter. To more clearly focus on the features of a memory having a majority detection process in which a subset of data bits are excluded from the majority detection process, as described herein, only one of the data output nodes and its associated group of structures is shown.

In an embodiment, data is represented by N bits partitioned into M groups with K bits per group in which L bits of each group are excluded from the majority detection process and the remaining K-L bits, a subset of the K bits, undergoes a majority detection process. Each of the K-L bits is bit-wise subjected to the majority detection process in conjunction with corresponding bits from the other groups. Relative to one data output node, each bit of its corresponding group is at a bit location of the group of bits. FIG. 9A illustrates an architecture in which data is represented by 128 bits partitioned into 16 groups, each group is assigned to a data output node and has eight bits in which the first two bits, effectively at the first two bit locations, are skipped in a majority detection process on each group. Alternatively, the bits for skipping may vary in number and be located at effective bit locations other than the $1^{st}$ and $2^{nd}$ bit position.

Data output node, DQ0, 950 serially outputs 8 bits that are operatively provided by parallel-to-serial converter 955 in which the $1^{st}$ and $2^{nd}$ bits skip the majority detection process and the $3^{rd}$-the $8^{th}$ bits are processed by majority detection unit 910. The 8 bits for the DQ0 group, output form the memories' storage cells, are amplified by the 8 data sense amplifiers (DSAs) 905 and provided to the 8 drivers 930 in a one-to-one correspondence. A subset of the 8 data bits, 6 in number, is provided to majority detection unit 910. These 6 data bits may also be accompanied by the inversion each of these 6 data bits. Alternately, the 6 data bits may be inverted in majority detection unit 910.

Majority detection unit 910 also receives 6 bits from each of the other 15 groups assigned to the 15 other DQs. Each of the bits from the 16 groups is assigned to a bit location such that majority detection unit 910 operates on the bits from the groups at a common location. Majority detection unit 910 operates on the $3^{rd}$ bit from each of the 16 groups to generate to the $3^{rd}$ driver of the drivers 930 a datainvert_$3^{rd}$ signal (data bit inversion signal) indicative of the result of the majority detection process for the $3^{rd}$ bits, or bit locations, of the 16 groups. The datainvert_$3^{rd}$ signal indicates to the $3^{rd}$ driver for DQ0 whether the data bit or the data bit inverted is to be provided to the $3^{rd}$ datapath of datapaths 925 for pre-charge prior to output from DQ0 of the memory. The datainvert_$3^{rd}$ signal is also provided to the $3^{rd}$ driver for each of DQ1-DQ15. Each of the other bit locations, $4^{th}$-$8^{th}$, is processed in a similar manner as for the $3^{rd}$ bit with generation of datainvert_$4^{th}$ signal-datainvert_$8^{th}$ signal to provide the results of these 6 majority detection operations. Majority detection unit 910 may be configured as 6 majority detectors, one for each bit location, $3^{rd}$-$8^{th}$. A majority detector may be arranged to operate on the relevant subset of data bits in a manner similar to that discussed in FIGS. 7 and 8. Majority detection unit 910 may be configured as one majority detector such that bits from one bit location from each bit locations, $3^{rd}$-$8^{th}$, are operated on in a serial fashion. In an embodiment, majority detection unit 910 does not provide the first and second drivers of drivers 930 with a datainvert signal, since the $1^{st}$ and $2^{nd}$ bit are processed from the $1^{st}$ and $2^{nd}$ DSA of DSAs 905 to the $1^{st}$ and $2^{nd}$ datapaths of datapaths 925 skipping the majority detection process.

Parallel-to-serial converter 955 receives the 8 bits for output from DQ0 950. The $1^{st}$ bit is provided to DQ0 first followed by the $2^{nd}$-$8^{th}$ bit. Each bit, $j^{th}$, $1 \leq j \leq 8$ is output from DQ0 concurrently with the $j^{th}$ bit of each of DQ1-DQ15. Each group of 16 bits that corresponds to the $3^{rd}$ to the $8^{th}$ bit location may be output in an inversion state (inverted or non-inverted) corresponding to the majority detection process for the respective bit location. For example, the 16 bits from the $3^{rd}$ bit location may be inverted while the 16 bits of the $4^{th}$ bit location are not inverted. For use of the data by a device coupled to memory device 900, the inversion status of the 16 bits for the $3^{rd}$-$8^{th}$ bit locations should be provided to the other device.

The inversion status from memory device 900 is provided at the DBI node 940 with the status for each bit location provided in a serial manner correlated to the output of the 16 bits of the same bit locations. In addition to providing data-invert_$3^{rd}$-datainvert_$8^{th}$ for the corresponding drivers of each DQ output node, majority detection unit provides these data inversion signals to parallel-to-serial converter 945 for serial output at DBI node 940. Allowing the first two bits for each DQ output node to skip the majority detect circuitry eliminates a speed penalty that may occur with conducting a majority detection process of data bits prior to output from the memory. This exclusion process provides time to perform the analysis of the $3^{rd}$-$8^{th}$ bits before these bits are to be at their appropriate DQ output node.

The bit exclusion architecture for a memory having a majority detection process is not limited to data represented by 128 bits in 16 groups of 8 bits with the first two bits of each bit being the excluded bits. Data may be represented by N bits in M groups of K bits, where L bits in each group are excluded from the majority detection process. The selection of the values for N, M, K, and L depend on the embodiment implemented. In an embodiment, memory device 900 may be realized as, but not limited to, a DRAM.

Figure 9B:
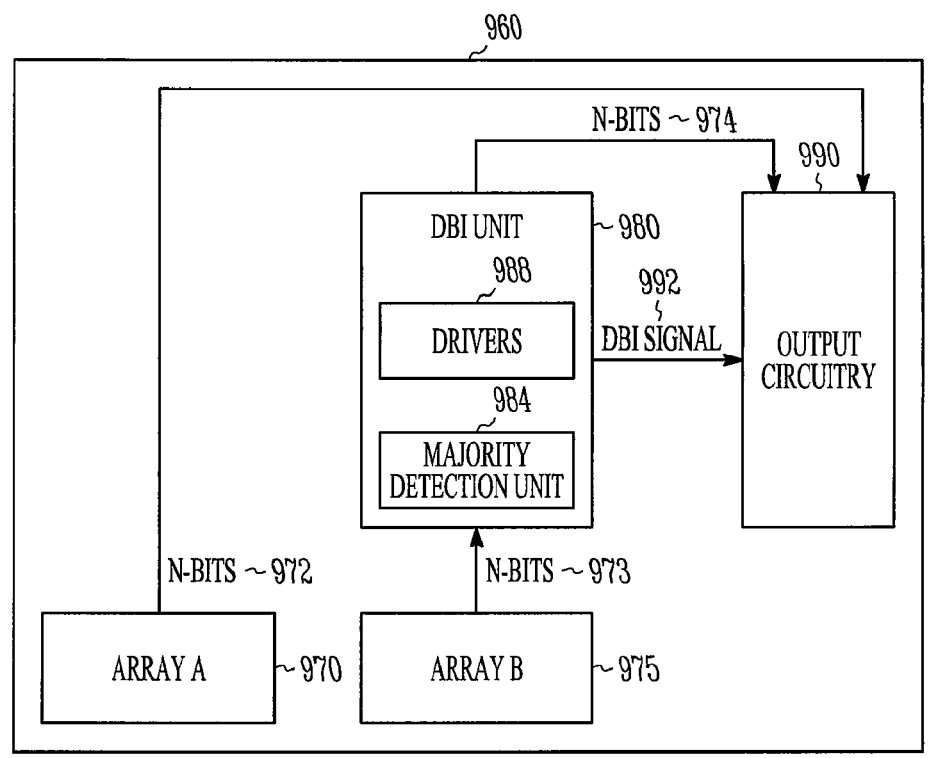
FIG. 9B shows a block diagram illustrating features of a memory device that includes a majority detection process in which a number of bits from a group of data bits are excluded from the majority detection process, according to various embodiments of the invention.

FIG. 9B shows a block diagram illustrating features of a memory device 960 that includes a majority detection process in which a number of bits from a group of data bits are excluded from the majority detection process, according to various embodiments. Memory device 960 may be configured to output 2N bits, where N bits 972 are stored in array A 970 and N bits 973 are stored in array B 975. N bits 972 from array 970 may be provided to output circuitry 990 together without being in a particular order. N bits 973 from array 975 or N bits 973 from array 975 inverted may be provided to output circuitry 990 together as N bits 974. N bits 972 are excluded from a majority detection process, while a majority detection process is applied to N bits 973. N bits 973 need not be provided from array 975 in a particular order.

Data bit inversion (DBI) unit 980 includes drivers 988 and a majority detection unit 984 to operate on N bits 973. If it is determined by operation of majority detection unit 984 that N bits 973 should be inverted, N bits 974 are provided to output circuitry 990 as an inverted version of N bits 973. If it is determined by operation of majority detection unit 984 that N bits 973 should not be inverted, N bits 973 are provided to output circuitry 990 as N bits 974. With the majority detection process and possible inversion operation, a DBI signal 992 indicative of the state of N bits 974 is provided by DBI unit 980 to output circuitry 990.

On a read command to fetch 2N bits, N bits 972 from array 970 and N bits 973 from array 975 are fetched. With memory array 975 physically located closer to output circuitry 990 than memory array 970, N bits 973, if not processed through DBI unit 980, would arrive sooner at output circuitry 990 than N bits 972. This time difference allows N bits 973 to be processed by DBI unit 980 such that N bits 974 arrive at output circuitry 990 with N bits 972 for N bits 974 and N bits 972 to be output at the same time by output circuitry 990. Memory device 960 may include memory cell arrays in addition to array 970 and array 975 on a common integrated circuit chip. The bits may be fetched from other memory arrays of memory device 960. Memory device 960 is not limited to fetching an equal number of bits when accessing two or more memory arrays. The 2N bits may be distributed as M+K bits, where M does not equal K.

Various embodiments of structures, as illustrated in FIGS. 2-9B but not limited by these figures, can be constructed in memory devices in integrated circuits using conventional techniques. Various process techniques applied to memory types, which include DRAMs, static random access memory (SRAM), synchronous dynamic random access memory (SDRAM), synchronous graphics random access memory (SGRAM), double data rate dynamic ram (DDR), and double data rate (SDRAM), may be employed to fabricate various embodiments for memories as taught herein. Structures of various embodiments may be realized in simulation packages that may be arranged as software, hardware, or a combination of software and hardware packages to simulate various embodiments and/or the operation of various embodiments.

Figure 10:
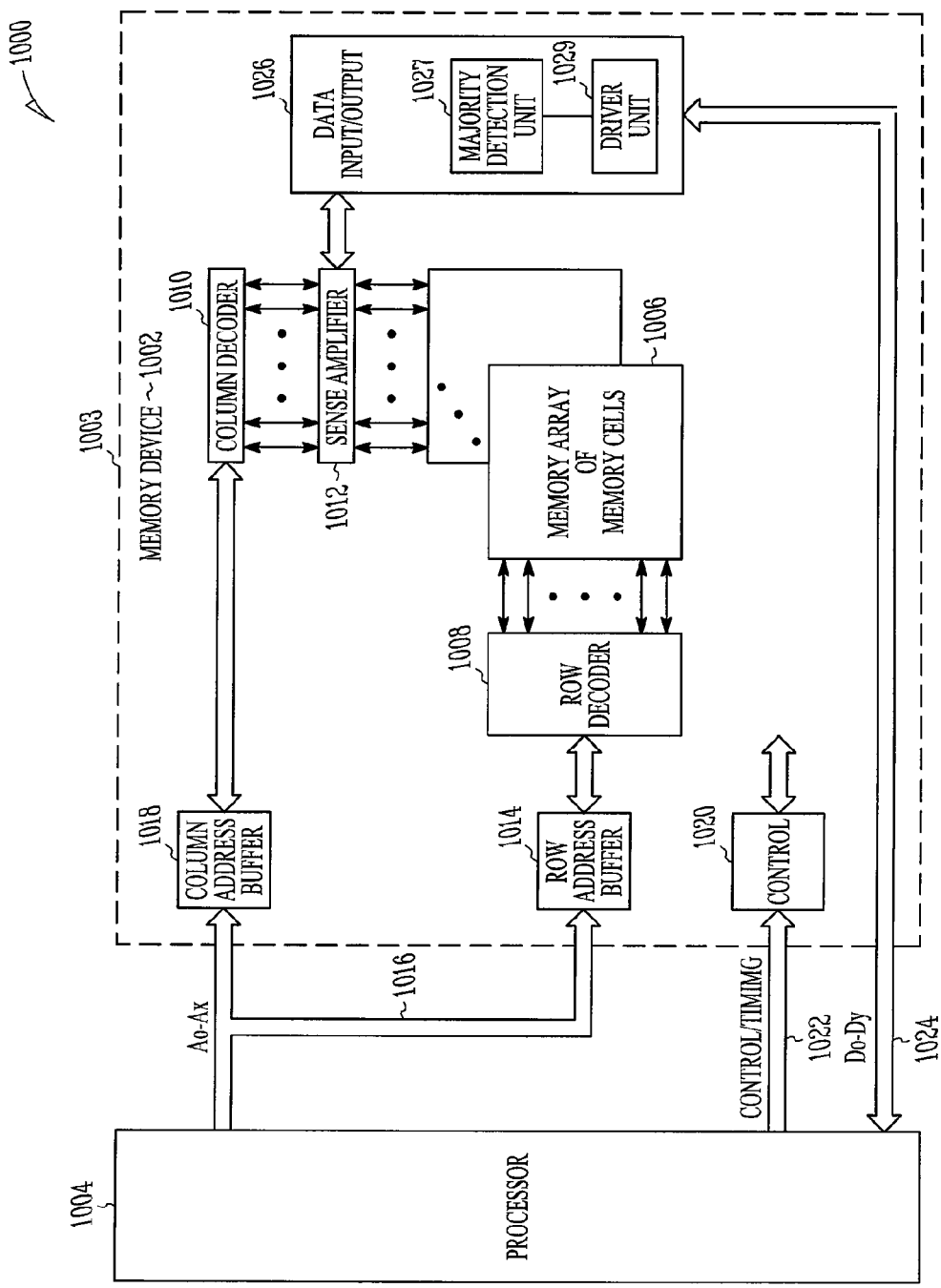
FIG. 10 shows a block diagram of an electronic system, according to various embodiments of the invention.

FIG. 10 shows a block diagram of various features of an electronic system 1000, according to various embodiments of the invention. Electronic system 1000 may be formed in various manners coupling the individual components of electronic system 1000 together or integrating the components into one or a number of units using conventional techniques. Electronic system 1000 may include one or more memory devices 1002 coupled to a processor 1004. Memory devices 1002 can be arranged as a number of packaged integrated circuits. Memory devices 1002 may be formed on a substrate 1003. Substrate 1003 may comprise material used in forming a memory device using conventional semiconductor processing techniques. Memory device 1002 includes a plurality of memory cells that are generally arranged in rows and columns in one or more memory arrays of memory cells 1006. Memory device 1002 may also include a row decoder 1008 and a column decoder 1010. Row decoder 1008 operates in combination with a row address buffer 1014 to receive address signals on an address bus 1016 coupled to processor 1004. Accordingly, the address signals received by row decoder 1008 and row address buffer 1014 are operable to direct the memory device 1002 to one or more rows in the array 1006. Similarly, a column address buffer 1018 may be provided that operates in combination with column decoder 1010 to receive the address signals on address bus 1016, so that memory device 1002 may be directed to one or more columns in array 1006.

Electronic system 1000 may also include a control unit 1020, which is operable to receive control signals on a control/timing bus 1022, and to interpret various memory access requests. Once memory device 1002 is accessed by receiving suitable control and address signals from processor 1004, data may be communicated to or from memory device 1002 on a data bus 1024, which is coupled to a data input/output unit 1026. Data input/output unit 1026 is operable to read or write the data to array 1006 in combination with a sense amplifier 1012. Data input/output unit 1026 may include one or more embodiments for a majority detection unit 1027 and driver unit 1029 that operate in conjunction with sense amplifier 1012 to realize a data bit inversion process within memory device prior to output of data on data lines D0-Dy.

Figure 11:
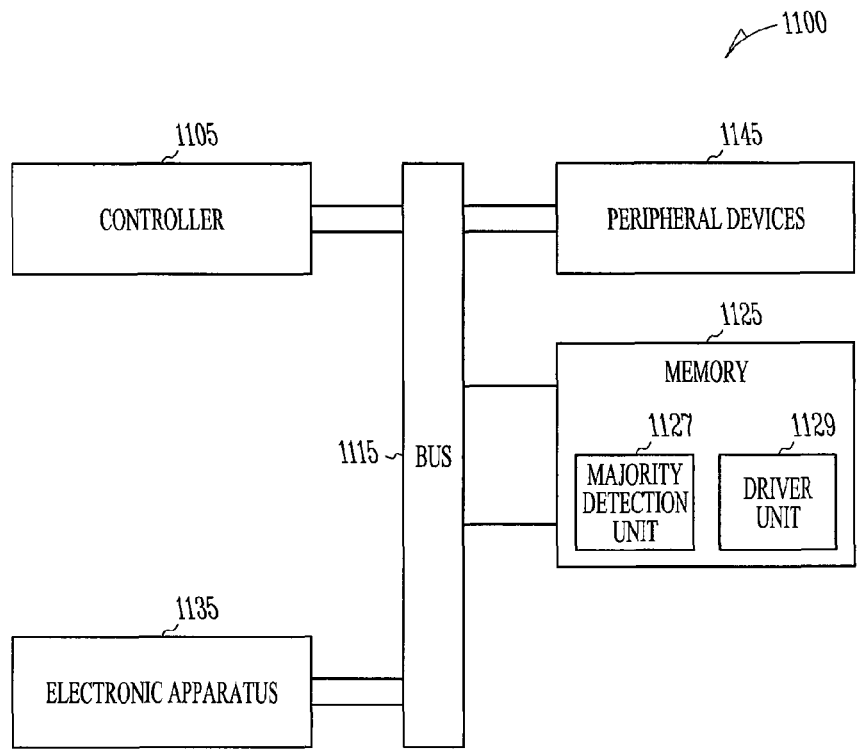
FIG. 11 shows a block diagram of a system having a controller and a memory including one or more embodiments for a majority detection unit and drivers that operate to realize a data bit inversion process within the memory prior to output of data, according to various embodiments of the invention.

FIG. 11 shows a block diagram of a system 1100 having a controller 1105 and a memory 1125 including one or more embodiments for a majority detection unit 1127 and driver unit 1129 that operate to realize a data bit inversion process within memory 1125 prior to output of data, according to various embodiments of the invention. System 1100 may be formed in various manners coupling the individual components of system 1100 together or integrating the components into one or a number of units using conventional techniques. In an embodiment, system 1100 also includes an electronic apparatus 1135 and a bus 1115, where bus 1115 provides electrical conductivity between controller 1105 and electronic apparatus 1135 and between controller 1105 and memory 1125. In an embodiment, bus 1115 includes an address bus, a data bus, and a control bus, each independently configured. In an alternative embodiment, bus 1115 uses common conductive lines for providing one or more of address, data, or control, the use of which is regulated by controller 1105. In an embodiment, electronic apparatus 1135 includes additional memory configured in a manner including an embodiment for a majority detection unit and drivers that operate on data bits to realize a data bit inversion process within such a memory, prior to an output from the memory that includes the data bits, the data bits inverted, or a combination of some of the data bits and others of the data bits inverted. In an embodiment, additional peripheral device or devices 1145 are coupled to bus 1115. In various embodiments, peripheral devices 1145 include displays, imaging devices, printing devices, wireless devices, additional storage memory, control devices that may operate in conjunction with controller 1105. In various embodiments, controller 1105 is a processor. In an embodiment, system 1100 includes, but is not limited to, fiber optic systems or devices, electro-optic systems or devices, optical systems or devices, imaging systems or devices, and information handling systems or devices such as wireless systems or devices, telecommunication systems or devices, and computers.

Figure 12:
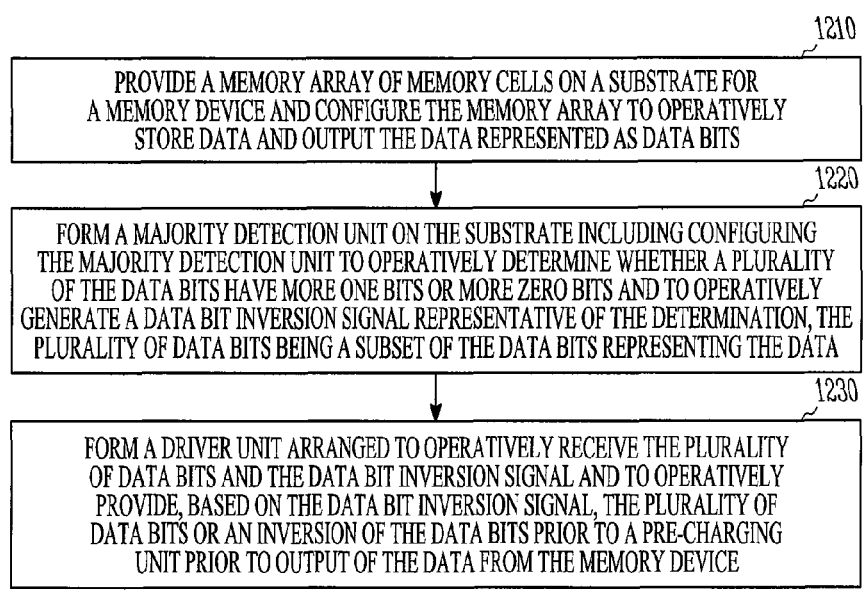
FIG. 12 shows features of a method that includes forming an apparatus having a memory device with a majority detection process for possible data bit inversion of bits representing data prior to output the data from a memory device, according to various embodiments of the invention.

FIG. 12 shows features of a method that includes forming an apparatus having a memory device with a majority detection process for possible data bit inversion of bits representing data prior to output of the data from the memory device, according to various embodiments of the invention. At 1210, a memory array of memory cells is provided on a substrate for a memory device. The memory array may be configured to operatively store data and output the data represented as data bits.

At 1220, a majority detection unit may be arranged on the substrate, where the majority detection unit may be configured to operatively determine whether a plurality of the data bits have more one bits or more zero bits and to operatively generate a data bit inversion signal representative of the determination. The plurality of data bits may be a subset of the data bits representing the data. The construction of the apparatus may include coupling data sense amplifiers to the majority detection unit to operatively provide the plurality of data bits to the majority detection unit. The method may include providing the majority detection unit with an input to receive an enable signal to conduct a majority detection operation such that the enable signal is operatively correlated to a clock signal coupled to the data sense amplifiers. The method may also include providing a delay unit arranged to operatively receive the clock signal coupled to the data sense amplifiers and to operatively provide the enable signal to the majority detector as a delayed version of the clock signal coupled to the data sense amplifiers.

The majority detection unit may be formed including forming a first evaluation unit arranged to receive the plurality of data bits, forming a second evaluation arranged to receive the plurality of data bits inverted, and forming a comparison unit coupled to an output of the first evaluation unit and coupled to an output of the second evaluation unit. The comparison unit may be formed having an output to operatively provide the data bit inversion signal to other components of the memory device and for transfer from the memory device to circuits external to the memory device.

At 1230, a driver unit may formed as an arrangement to operatively receive the plurality of data bits, to operatively receive the data bit inversion signal from the majority detection unit, and to operatively provide, based on the data bit inversion signal, the plurality of data bits or an inversion of the data bits prior to output of the data from the memory device. The driver unit may be arranged to provide the relevant data bits in an appropriate inverted or non-inverted format prior to a pre-charging unit before output of the data from the memory device. The construction of the apparatus may include coupling the data sense amplifiers to the driver unit to operatively provide the plurality of data bits to the driver unit in addition to providing these data bits to the majority detection unit.

The driver unit may be formed as a plurality of drivers coupled to a pre-charging unit. The pre-charging unit may be constructed having a plurality of datapaths, where each datapath is formed having a conductive line and a device to couple the conductive line to a reference voltage to pre-charge the conductive line. The drivers and the datapaths may be formed such that there is a one-to-one correspondence between the drivers and the datapaths. The drivers and the datapaths may also be formed in a one-to-one correspondence with data sense amplifiers.

The memory device may be formed having an architectural structure such that the bits representing the data are all subjected to the majority detection process conducted by the majority detection unit. Alternatively, memory device may be formed having an architectural structure such that the bits representing the data includes one or more bits in addition to a plurality of data bits that are subjected to the majority detection process conducted by the majority detection unit such that the one or more bits are excluded from operation of the majority detection unit.

In various embodiment, a method for forming a memory device with a majority detection process for possible data bit inversion of bits representing data prior to output the data from a memory device, according to various embodiments may include coupling the memory device to other units to form a system. The memory device may be coupled to a processor in a system. The construction of a system may include, but is not limited to, forming fiber optic systems or devices, forming electro-optic systems or devices, forming optical systems or devices, forming imaging systems or devices, and forming information handling systems or devices such as wireless systems or devices, telecommunication systems or devices, and computers.

Figure 13:
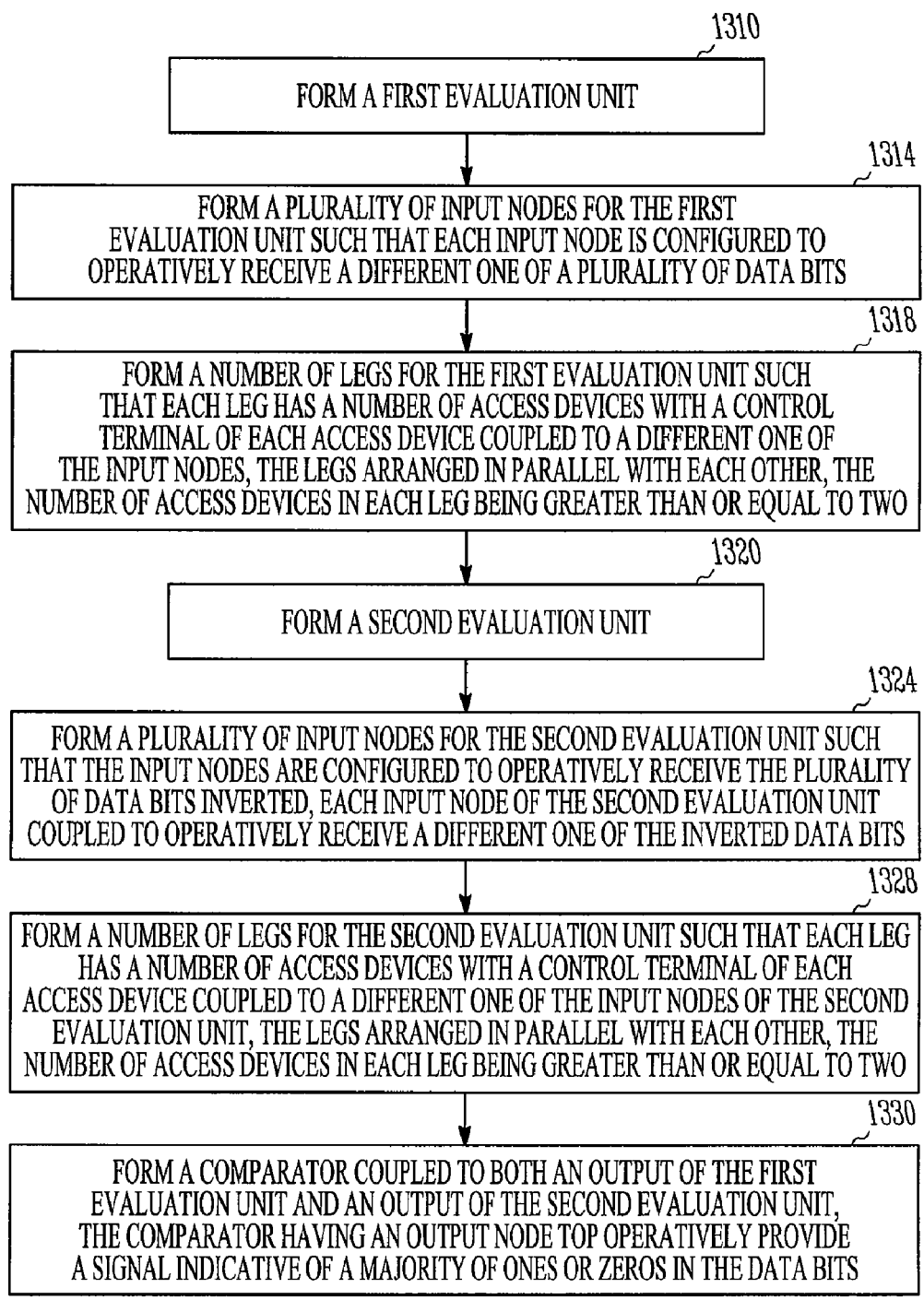
FIG. 13 shows features of a method that includes forming an apparatus to provide a signal indicative of a majority of a value in a group of possible values, according to various embodiments of the invention.

FIG. 13 shows features of a method that includes forming an apparatus to provide a signal indicative of a majority of a value in a group of possible values, according to various embodiments of the invention. In an embodiment, an apparatus is formed including a structure to operatively provide a signal indicative of a majority of ones or zeros in data bits examined. At 1310, a first evaluation unit is formed. At 1314, a plurality of input nodes for the first evaluation unit is formed such that each input node is configured to operatively receive a different one of a plurality of data bits.

At 1318, a number of legs for the first evaluation unit is formed such that each leg has a number of access devices with a control terminal of each access device coupled to a different one of the input nodes. The legs are arranged in parallel with each of the other legs. The number of access devices in each leg of the first evaluation unit formed is greater than or equal to two. In an embodiment, a method includes structuring the apparatus such that the plurality of data bits is equal to the multiplicative product of the number of legs and the number of access devices for each leg for the first evaluation unit. In an embodiment, a method includes forming the access devices of the first evaluation unit to include transistors with the number of access devices in each leg of the first evaluation unit equal to two and forming the control terminal of each access device as a transistor gate such that the two transistors in each leg of the first evaluation unit are arranged in series.

At 1320, a second evaluation unit is formed. At 1324, a plurality of input nodes for the second evaluation unit is formed such that the input nodes are configured to operatively receive the plurality of data bits inverted. Each input node of the second evaluation unit is coupled to operatively receive a different one of the inverted data bits. At 1328, a number of legs for the second evaluation unit is formed such that each leg has a number of access devices with a control terminal of each access device coupled to a different one of the input nodes of the second evaluation unit. The legs are arranged in parallel with each of the other legs. The number of access devices in each leg of the second evaluation unit formed is greater than or equal to two. In an embodiment, a method includes structuring the apparatus such that the plurality of data bits inverted is equal to the multiplicative product of the number of legs and the number of access devices for each leg for the second evaluation unit. In an embodiment, a method includes forming the access devices of the second evaluation unit to include transistors with the number of access devices in each leg of the second evaluation unit equal to two and forming the control terminal of each access device as a transistor gate such that the two transistors in each leg of the second evaluation unit are arranged in series.

At 1330, a comparator is formed coupled to both an output of the first evaluation unit and an output of the second evaluation unit. The comparator is formed with an output node to operatively provide a signal indicative of a majority of ones or zeros in the data bits from a comparison of the outputs from the first and second evaluation units. In an embodiment, the first and second evaluation units and the comparator in a device are formed to enable operative data bit inversion of the plurality of data bits based on the signal indicative of a majority of ones or zeros from the comparator such that the data bit inversion is operatively conducted within the device. In an embodiment, forming an apparatus includes, but is not limited to, forming a DRAM.

Embodiments of methods for forming a structure to operatively provide a signal indicative of a majority of ones or zeros in data bits examined may include forming the structure as part of a memory device. Such a structure formed as part of a memory device may be located within the memory device such that operation of the structure allows reduction in power consumption in the memory device relative to the memory device not utilizing such a structure. In various embodiments, the structures may be formed in other apparatus and may be formed in memory devices constructed as part of a system. Conventional techniques for memory devices and system may be implemented in forming various embodiments of a majority detection structures, memory devices having a majority detection process, and systems constructed with memory devices having a majority detection process, as described herein, Although specific embodiments have been illustrated and described herein, it will be appreciated by those of ordinary skill in the art that any arrangement that is calculated to achieve the same purpose may be substituted for the specific embodiments shown. Various embodiments may use permutations and/or combinations of embodiments described herein. It is to be understood that the above description is intended to be illustrative, and not restrictive, and that phraseology or terminology employed herein is for the purpose of description and not of limitation.

What is claimed is:

1. A memory device comprising:
    a majority detection unit to determine, with respect to an operative output of data stored in the memory device, whether a plurality of data bits have more one bits or more zero bits and to generate a data bit inversion signal representative of the determination, the plurality of data bits being a subset of bits representing the data;
    a driver unit arranged to operatively receive the plurality of data bits and the data bit inversion signal and to operatively provide, based on the data bit inversion signal, the plurality of data bits or an inversion of the data bits to a pre-charging unit prior to output of the data from the memory device; and
    a data bit inversion node coupled to the majority detection unit to transmit the data bit inversion signal externally from the memory device to another device.

2. The memory device of claim 1, wherein the driver unit is configured to provide the inversion to the data bits at a location in the memory device such that the inversion reduces power consumption relative to non-inversion of the data bits.

3. The memory device of claim 1, wherein the memory device includes data sense circuitry coupled to the majority detection unit and to the driver unit to operatively provide the plurality of data bits to the majority detection unit and to the driver unit.

4. The memory device of claim 1, wherein the bits representing the data includes one or more bits in addition to the plurality of data bits such that the one or more bits are excluded from operation of the majority detection unit.

5. A memory device comprising:
    a majority detection unit to determine, with respect to an operative output of data stored in the memory device, whether a plurality of data bits have more one bits or more zero bits and to generate a data bit inversion signal representative of the determination, the plurality of data bits being a subset of bits representing the data; and
    a driver unit arranged to operatively receive the plurality of data bits and the data bit inversion signal and to operatively provide, based on the data bit inversion signal, the plurality of data bits or an inversion of the data bits to a pre-charging unit prior to output of the data from the memory device, the driver unit configured to provide the inversion to the data bits at a location in the memory device such that the inversion reduces power consumption relative to non-inversion of the data bits, wherein the majority detection unit includes an input to receive an enable signal to conduct a majority detection operation, the enable signal correlated to a clock signal coupled to the data sense circuitry.

6. The memory device of claim 5, wherein the memory device includes a delay unit arranged to receive the clock signal coupled to the data sense circuitry and to provide the enable signal to the majority detector as a delayed version of the clock signal coupled to the data sense circuitry.

7. A memory device comprising:
    a majority detection unit to determine, with respect to an operative output of data stored in the memory device, whether a plurality of data bits have more one bits or more zero bits and to generate a data bit inversion signal representative of the determination, the plurality of data bits being a subset of bits representing the data; and a driver unit arranged to operatively receive the plurality of data bits and the data bit inversion signal and to operatively provide, based on the data bit inversion signal, the plurality of data bits or an inversion of the data bits to a pre-charging unit prior to output of the data from the memory device, wherein the driver unit includes a plurality of drivers and the pre-charging unit includes a plurality of datapaths, each datapath having a conductive line and a device, the device having a pre-charge enable input to couple the conductive line to a reference voltage to pre-charge the conductive line, such that there is a one-to-one correspondence between the drivers and the datapaths.

8. A memory device comprising:

a majority detection unit to determine, with respect to an operative output of data stored in the memory device, whether a plurality of data bits have more one bits or more zero bits and to generate a data bit inversion signal representative of the determination, the plurality of data bits being a subset of bits representing the data; and a driver unit arranged to operatively receive the plurality of data bits and the data bit inversion signal and to operatively provide, based on the data bit inversion signal, the plurality of data bits or an inversion of the data bits to a pre-charging unit prior to output of the data from the memory device, wherein the majority detection unit includes:

a first evaluation unit arranged to receive the plurality of data bits;

a second evaluation unit arranged to receive the plurality of data bits inverted: and a comparison unit coupled to an output of the first evaluation unit and coupled to an output of the second evaluation unit, the comparison unit having an output to provide the data bit inversion signal.

9. A memory device comprising:

a majority detection unit to determine, with respect to an operative output of data stored in the memory device, whether a plurality of data bits have more one bits or more zero bits and to generate a data bit inversion signal representative of the determination, the plurality of data bits being a subset of bits representing the data; and a driver unit arranged to operatively receive the plurality of data bits and the data bit inversion signal and to operatively provide, based on the data bit inversion signal, the plurality of data bits or an inversion of the data bits to a pre-charging unit prior to output of the data from the memory device, wherein the data bits are operatively arranged as a plurality of bursts, each burst having more than 4 bits such that a first two bits of the burst are operatively directed to an output of the memory device without operation of the majority detection unit on the first two bits.

10. A memory device comprising:

an array of data storage cells arranged such that data is output as a data bits from the array, the data bits arranged as a plurality of groups of bits, each group of bits having a common number of effective bit locations;

data output nodes to output the data from the memory device, each data output node correlated to a different one of the groups of bits;

a majority detection unit to apply a majority detection process to the data bits being output from the array to determine whether the data bits corresponding to a common bit location of the groups of bits have more one bits or more zero bits for each common bit location and to generate a data bit inversion signal representative of the determination for each common bit location, the majority detection unit configured to operatively skip the majority detection process for a number of common bit locations of each group based on positions of the number of common bit locations of each group skipped relative to bit locations of each group not skipped; and a driver unit arranged to receive each group of data bits and the data bit inversion signal corresponding to each common bit location group and to operatively provide, based on the data bit inversion signal, each data bit of each group or an inversion of each data bit to a pre-charging unit prior to output of the data from the memory device.

11. A memory device comprising:

an array of data storage cells arranged such that data is output as a data bits from the array, the data bits arranged as a plurality of groups of bits, each group of bits having a common number of effective bit locations;

data output nodes to output the data from the memory device, each data output node correlated to a different one of the groups of bits;

a majority detection unit to apply a majority detection process to determine whether the data bits corresponding to a common bit location of the groups of bits have more one bits or more zero bits for each common bit location and to generate a data bit inversion signal representative of the determination for each common bit location, the majority detection unit configured to operatively skip the majority detection process for a number of common bit locations of each group; and a driver unit arranged to receive each group of data bits and the data bit inversion signal corresponding to each common bit location group and to operatively provide, based on the data bit inversion signal, each data bit of each group or an inversion of each data bit to a pre-charging unit prior to output of the data from the memory device, wherein the majority detection unit is configured as a plurality of majority detectors such that the each majority detector operates on the data bits of the groups having a corresponding common bit location.

12. A memory device comprising:

an array of data storage cells arranged such that data is output as a data bits from the array, the data bits arranged as a plurality of groups of bits, each group of bits having a common number of effective bit locations;

data output nodes to output the data from the memory device, each data output node correlated to a different one of the groups of bits;

a majority detection unit to apply a majority detection process to determine whether the data bits corresponding to a common bit location of the groups of bits have more one bits or more zero bits for each common bit location and to generate a data bit inversion signal representative of the determination for each common bit location, the majority detection unit configured to operatively skip the majority detection process for a number of common bit locations of each group;

a driver unit arranged to receive each group of data bits and the data bit inversion signal corresponding to each common bit location group and to operatively provide, based on the data bit inversion signal, each data bit of each group or an inversion of each data bit to a pre-charging unit prior to output of the data from the memory device;

data sense amplifiers, each data sense amplifier to provide a different one of the data bits to the driver unit;

datapaths, each datapath having a conductive line and a device to couple the conductive line to a reference voltage to pre-charge the conductive line; and drivers configured as part of the driver unit, each driver coupled to a different sense amplifier to receive one of the data bits, coupled to the majority detection unit to operatively receive the data inversion signal corresponding to the one data bit when the one data bit is not at one of the number of common bit locations skipped by the majority detection unit, and coupled to a different one of the datapaths to provide the one data bit or the one data bit inverted, based on the data inversion signal corresponding to the one data bit, prior to pre-charging.

13. The memory device of claim 12, wherein the memory device includes a plurality of parallel-to-serial converters, each parallel-to-serial converter corresponding to a different one of the data output nodes, each parallel-to-serial converter coupled to a plurality of the datapaths to receive in parallel data bits corresponding to the plurality of the datapaths and coupled to the corresponding data output node to serially output the data bits corresponding to the plurality of the datapaths.

14. A memory device comprising:

an array of data storage cells arranged such that data is output as a data bits from the array, the data bits arranged as a plurality of groups of bits, each group of bits having a common number of effective bit locations;

data output nodes to output the data from the memory device, each data output node correlated to a different one of the groups of bits;

a majority detection unit to apply a majority detection process to determine whether the data bits corresponding to a common bit location of the groups of bits have more one bits or more zero bits for each common bit location and to generate a data bit inversion signal representative of the determination for each common bit location, the majority detection unit configured to operatively skip the majority detection process for a number of common bit locations of each group; and a driver unit arranged to receive each group of data bits and the data bit inversion signal corresponding to each common bit location group and to operatively provide, based on the data bit inversion signal, each data bit of each group or an inversion of each data bit to a pre-charging unit prior to output of the data from the memory device;

a data bit inversion node to output from the memory device one of the data bit inversion signals; and a parallel-to-serial converter coupled to the majority detection unit to receive in parallel the data bit inversion signals representative of the majority detection determination for each common bit location, the parallel-to-serial converter arranged to output serially the data bit inversion signal for each common bit location.

15. A memory device comprising:

an array of data storage cells arranged such that data is output as a data bits from the array, the data bits arranged as a plurality of groups of bits, each group of bits having a common number of effective bit locations;

data output nodes to output the data from the memory device, each data output node correlated to a different one of the groups of bits;

a majority detection unit to apply a majority detection process to determine whether the data bits corresponding to a common bit location of the groups of bits have more one bits or more zero bits for each common bit location and to generate a data bit inversion signal representative of the determination for each common bit location, the majority detection unit configured to operatively skip the majority detection process for a number of common bit locations of each group; and a driver unit arranged to receive each group of data bits and the data bit inversion signal corresponding to each common bit location group and to operatively provide, based on the data bit inversion signal, each data bit of each group or an inversion of each data bit to a pre-charging unit prior to output of the data from the memory device, wherein the majority detection unit includes a first evaluation unit arranged to receive data bits from common bit locations of each group and a second evaluation arranged to receive the data bits from common bit locations of each group inverted, and a comparison unit coupled to an output of the first evaluation unit and coupled to an output of the second evaluation unit, the comparison unit having an output to provide the data bit inversion signal corresponding to the common bit location.

* * * * *